(12) United States Patent
Chiang et al.

(10) Patent No.: US 11,403,564 B2
(45) Date of Patent: Aug. 2, 2022

(54) LITHOGRAPHIC HOTSPOT DETECTION USING MULTIPLE MACHINE LEARNING KERNELS

(71) Applicant: Synopsys, Inc., Mountain View, CA (US)

(72) Inventors: Charles C. Chiang, Saratoga, CA (US); Yen-Ting Yu, New Taipei (TW); Geng-He Lin, Hsinchu (TW); Hui-Ru Jiang, New Taipei (TW)

(73) Assignee: Synopsys, Inc., Mountain View, CA (US)

( * ) Notice: Subject to any disclaimer, the term of this patent is extended or adjusted under 35 U.S.C. 154(b) by 666 days.

(21) Appl. No.: 16/432,514

(22) Filed: Jun. 5, 2019

(65) Prior Publication Data

US 2019/0287021 A1    Sep. 19, 2019

Related U.S. Application Data

(63) Continuation of application No. 14/287,921, filed on May 27, 2014, now abandoned.
(Continued)

(51) Int. Cl.
*G06N 20/10* (2019.01)
*G06N 20/00* (2019.01)
(Continued)

(52) U.S. Cl.
CPC .............. *G06N 20/10* (2019.01); *G06N 20/00* (2019.01); *G06T 7/001* (2013.01); *G06V 10/424* (2022.01);
(Continued)

(58) Field of Classification Search
CPC ................................ G06N 20/10; G06N 20/00
(Continued)

(56) References Cited

U.S. PATENT DOCUMENTS 6,246,472 B1    6/2001    Yoda et al.
7,823,099 B2   10/2010    Tsai et al.
(Continued)

FOREIGN PATENT DOCUMENTS

CN        1358288 A     7/2002
CN      101482926 A     7/2009
(Continued)

OTHER PUBLICATIONS

Ding et al ("High performance lithographic hotspot detection using hierarchically refined machine learning", Asia and South Pacific Design Automation Conference (ASPDAC) 2011, Jan. 25-28, 2011) (Year: 2011).*
(Continued)

*Primary Examiner* — Lut Wong
(74) *Attorney, Agent, or Firm* — Fenwick & West LLP

(57) ABSTRACT

A hotspot detection system that classifies a set of hotspot training data into a plurality of hotspot clusters according to their topologies, where the hotspot clusters are associated with different hotspot topologies, and classifies a set of non-hotspot training data into a plurality of non-hotspot clusters according to their topologies, where the non-hotspot clusters are associated with different topologies. The system extracts topological and non-topological critical features from the hotspot clusters and centroids of the non-hotspot clusters. The system also creates a plurality of kernels configured to identify hotspots, where each kernel is constructed using the extracted critical features of the non-hotspot clusters and the extracted critical features from one of the hotspot clusters, and each kernel is configured to identify hotspot topologies different from hotspot topologies that the other kernels are configured to identify.

20 Claims, 9 Drawing Sheets

Related U.S. Application Data

(60) Provisional application No. 61/828,915, filed on May 30, 2013.

(51) Int. Cl.
  *G06T 7/00* (2017.01)
  *G06V 10/50* (2022.01)
  *G06V 10/424* (2022.01)
  *G06K 9/62* (2022.01)

(52) U.S. Cl.
  CPC ............ *G06V 10/50* (2022.01); *G06K 9/622* (2013.01); *G06K 9/6269* (2013.01); *G06T 2207/30144* (2013.01)

(58) Field of Classification Search
  USPC .......................................................... 706/12
  See application file for complete search history.

(56) References Cited

U.S. PATENT DOCUMENTS

| | | | |
|---|---|---|---|
| 7,987,150 | B1 | 7/2011 | Luu et al. |
| 8,260,728 | B1 | 9/2012 | Walsh et al. |
| 8,402,397 | B2 | 3/2013 | Robles et al. |
| 8,601,419 | B1 | 12/2013 | Chiang et al. |
| 9,098,649 | B2 | 8/2015 | Chiang et al. |
| 2003/0109952 | A1 | 6/2003 | Hosoya et al. |
| 2005/0256669 | A1 | 11/2005 | Mitsui |
| 2006/0111849 | A1 | 5/2006 | Schadt et al. |
| 2007/0185656 | A1 | 8/2007 | Schadt |
| 2007/0245281 | A1 | 10/2007 | Riepe et al. |
| 2009/0228408 | A1 | 9/2009 | Kaushal et al. |
| 2009/0324107 | A1 | 12/2009 | Walch |
| 2010/0127185 | A1 | 5/2010 | Fragner et al. |
| 2011/0161895 | A1 | 6/2011 | Reid et al. |
| 2011/0209107 | A1 | 8/2011 | Kodera et al. |
| 2012/0254333 | A1 | 10/2012 | Chandramouli et al. |
| 2013/0031518 | A1 | 1/2013 | Robles et al. |
| 2013/0031522 | A1* | 1/2013 | Robles ................ G06F 17/5081 716/112 |
| 2013/0061184 | A1 | 3/2013 | Guo et al. |
| 2013/0091479 | A1 | 4/2013 | Salem et al. |
| 2013/0163851 | A1 | 6/2013 | Dalia-Torre et al. |

FOREIGN PATENT DOCUMENTS

| | | | |
|---|---|---|---|
| TW | 201001213 | A | 1/2010 |
| TW | 201009624 | A | 3/2010 |
| TW | 201300963 | A | 1/2013 |

OTHER PUBLICATIONS

Wuu et al ("Efficient approach to early detection of lithographic hotspots using machine learning systems and pattern matching" 2011) (Year: 2011).*

Chinese First Office Action, Chinese Application No. 2014102408903, dated Jan. 6, 2017, 19 pages.

Chinese Second Office Action, Chinese Application No. 201410240890. 3, dated Sep. 25, 2017, 5 pages (with concise explanation of relevance).

Ding, D. et al., "High performance lithographic hotspot detection using hierarchically refined machine Tearning", Asia and South Pacific Design Automation Conference {ASPDAC) 2011, Jan. 25-28, 2011, Pacifico Yokohama, Yokohama, Japan.

Ding, D. et al., "High Performance Lithography Hotspot Detection with Successively Refined Pattern Identifications and Machine Learning", IEEE Transactions On Computer-Aided Design of Integrated Circuits And Systems, vol. 30, No. 11, Nov. 2011.

Ding, D. et al., "Machine learning based lithographic hotspot detection with critical-feature extraction and classification", Published in: International Conference on IC Design and Technology, 2009. ICICDT '09. IEEE, Date of Conference: May 18-20, 2009.

Ding, D. et al., "High Performance Lithographic Hotspot Detection Using Hierarchically Refined Machine Learning," Asia and South Pacific Design Automation Conference, IEEE, Dec. 31, 2011, pp. 775-780.

Ma, et al, "Automatic hotspot classification using pattern-based clustering", Design for Manufacturability through Design-Process Integration II, edited by Vivek K. Singh, Michael L Rieger, Proc. of SPIE vol. 6925, 692505, (2008).

Taiwan Office Action, Taiwan Application No. 103118882, dated Sep. 2, 2015, 7 pages.

Torres, A., "Fuzzy Pattern Match for Physical Verification," 2012 CAD Contest at ICCAD, Proc. ICCAD, 2012, pp. 349-350, [Online] [Retrieved on Nov. 5, 2014] Retrieved from the Internet<URL:http://cad_contest.cs.nctu.edu.tw/CAD-contest-at-ICCAD2012/problems/p3/p3.html>.

United States Office Action, U.S. Appl. No. 14/287,921, filed Apr. 15, 2019, 30 pages.

United States Office Action, U.S. Appl. No. 14/287,921, filed Nov. 23, 2018, 37 pages.

United States Office Action, U.S. Appl. No. 14/287,921, filed Nov. 2, 2017, 41 pages.

United States Office Action, U.S. Appl. No. 14/287,921, filed Dec. 8, 2016, 36 pages.

Yu, Y.T. et al., "Machine-Learning-Based Hotspot Detection Using Topological Classification and Critical Feature Extraction," IEEE Transactions on Computer-Aided Design of Integrated Circuits and Systems, 2015, vol. 34, No. 3, pp. 460-470.

The Chinese Patent Office, Office Action, Chinese Patent Application No. 201810720254.9, dated Sep. 18, 2021, 14 pages, (with concise explanation of relevance).

* cited by examiner

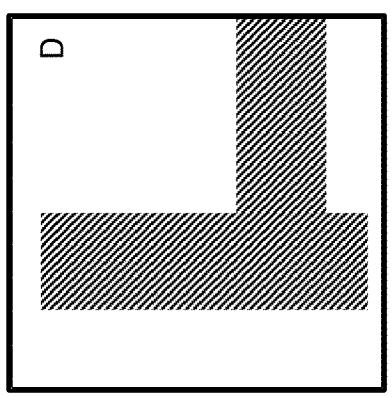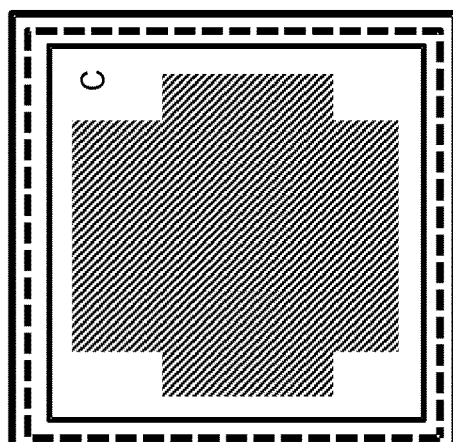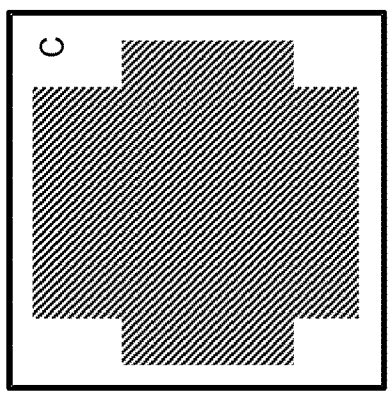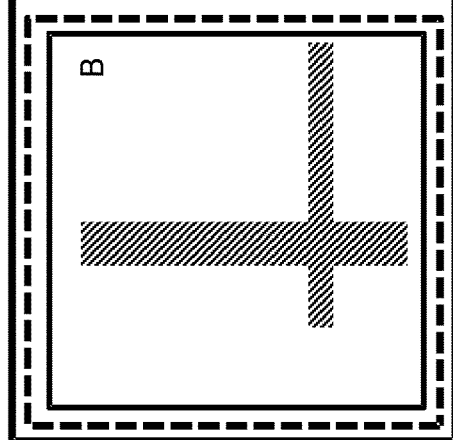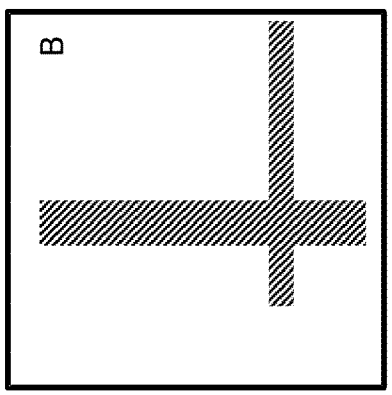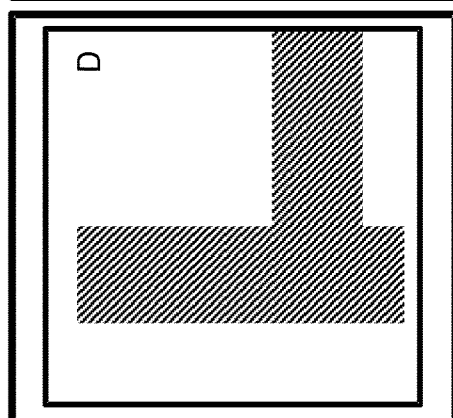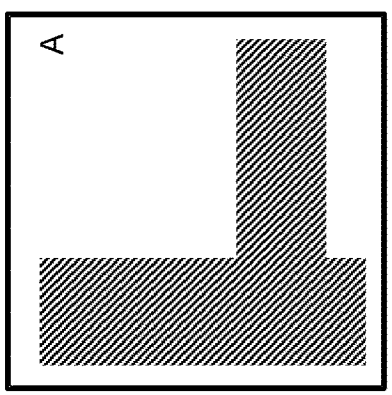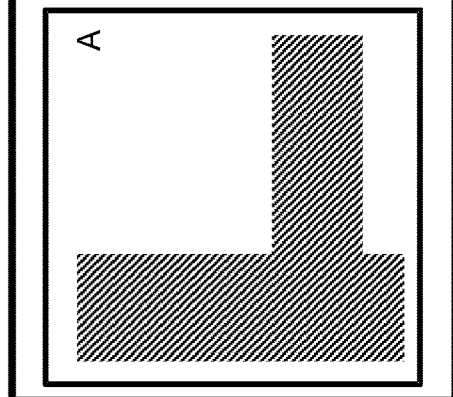
FIG. 4A
FIG. 4B

LITHOGRAPHIC HOTSPOT DETECTION USING MULTIPLE MACHINE LEARNING KERNELS

CROSS REFERENCE TO RELATED APPLICATION

This application is a continuation of U.S. application Ser. No. 14/287,921, filed May 27, 2014, which claims priority to Provisional Patent Application No. 61/828,915, filed May 30, 2013, all of which are incorporated herein by reference.

FIELD OF DISCLOSURE

This disclosure relates to the field of hotspot identification generally, and specifically to improved hotspot identification using machine learning.

DESCRIPTION OF THE RELATED ART

In advanced process technology, the ever-growing sub-wavelength lithography gap causes unwanted shape distortions of the printed layout patterns. Although design rule checking (DRC) and reticle/resolution enhancement techniques (RET), such as optical proximity correction (OPC) and subresolution assist features (SRAF), can alleviate the printability problem, many regions on a layout may still be susceptible to lithography process. These regions, so-called lithography hotspots, should be detected and corrected before mask synthesis. Hotspot detection, therefore, is an important task in physical verification.

Hotspot detection has attracted increasing attention in recent years and may be classified into four major categories, (1) lithography simulation, (2) pattern matching, (3) machine learning, and (4) hybrid. The full lithography simulation provides the most accurate detection result. However, the simulation suffers from an extremely high computational complexity and long runtime. Pattern matching is the fastest hotspot detection approach and is good at detecting pre-characterized hotspot patterns, but has a limited flexibility to recognize previously unseen ones. In contrast, machine learning is good at detecting unknown hotspots but needs special treatments to suppress the false alarm. The hybrid approach unites both pattern matching and machine learning engines (even with a lithography simulator) to enhance accuracy and reduce false alarm but may consume longer runtimes.

SUMMARY

The above and other needs are met by a computer-implemented method, a non-transitory computer-readable storage medium storing executable code, and corresponding systems. In one approach, different machine learning kernels are trained to identify different types of hotspot topologies. Layout clips that may contain a hotspot are applied to the machine learning kernels, and the results of the kernels are combined to identify hotspots within the layout clips.

One embodiment of a computer-implemented method for hotspot detection comprises defining a clip to represent a portion of an integrated circuit topology, and evaluating the clip using a plurality of kernels wherein the kernels identify different topologies that indicate a potential for a hotspot to occur.

One embodiment of a computer-implemented method for identifying hotspots on a test layout, comprises classifying a set of hotspot training data into a plurality of hotspot clusters according to their topologies, where the hotspot clusters are associated with different hotspot topologies. A set of non-hotspot training data is classified into a plurality of non-hotspot clusters according to their topologies, where the non-hotspot clusters are associated with different topologies. Topological and non-topological critical features are extracted from the hotspot clusters and centroids of the non-hotspot clusters, and the topological critical features are geometry related features that characterize a cluster and the non-topological critical features are lithographic processes related features that characterize a cluster. A plurality of kernels configured to identify hotspots are created, where each kernel is constructed using the extracted critical features of the centroids of the non-hotspot clusters and the extracted critical features from one of the hotspot clusters, and each kernel is configured to identify hotspot topologies different from hotspot topologies that the other kernels are configured to identify.

One embodiment of a non-transitory computer-readable storage medium storing executable computer program instructions for identifying hotspots on a test layout, comprises classifying a set of hotspot training data into a plurality of hotspot clusters according to their topologies, where the hotspot clusters are associated with different hotspot topologies. A set of non-hotspot training data is classified into a plurality of non-hotspot clusters according to their topologies, where the non-hotspot clusters are associated with different topologies. Topological and non-topological critical features are extracted from the hotspot clusters and centroids of the non-hotspot clusters, and the topological critical features are geometry related features that characterize a cluster and the non-topological critical features are lithographic processes related features that characterize a cluster. A plurality of kernels configured to identify hotspots are created, where each kernel is constructed using the extracted critical features of the centroids of the non-hotspot clusters and the extracted critical features from one of the hotspot clusters, and each kernel is configured to identify hotspot topologies different from hotspot topologies that the other kernels are configured to identify.

BRIEF DESCRIPTION OF DRAWINGS

FIG. 4A illustrates four patterns A, B, C, and D according to an embodiment.

FIG. 4B illustrates clusters {A, D}, {B}, and {C} according to an embodiment.

DETAILED DESCRIPTION

The Figures (FIGS.) and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality.

As used herein, a "hotspot" is a layout pattern that is at risk of inducing a printability issue at the fabrication stage. As used herein, a "hit" is an actual hotspot that has been correctly identified as a hotspot. Accuracy is the ratio of the number of total hits over the number of all actual hotspots. Additionally, as used herein, an "extra" is a non-hotspot that is mistakenly identified as a hotspot. A false alarm is the ratio of the number of total extras over the number of all actual hotspots. In this embodiment, the false alarm represents the false positives (how many non-hotspots are reported as hotspots), and accuracy reflects the false negatives (how many hotspots are missed).

Figure 1:
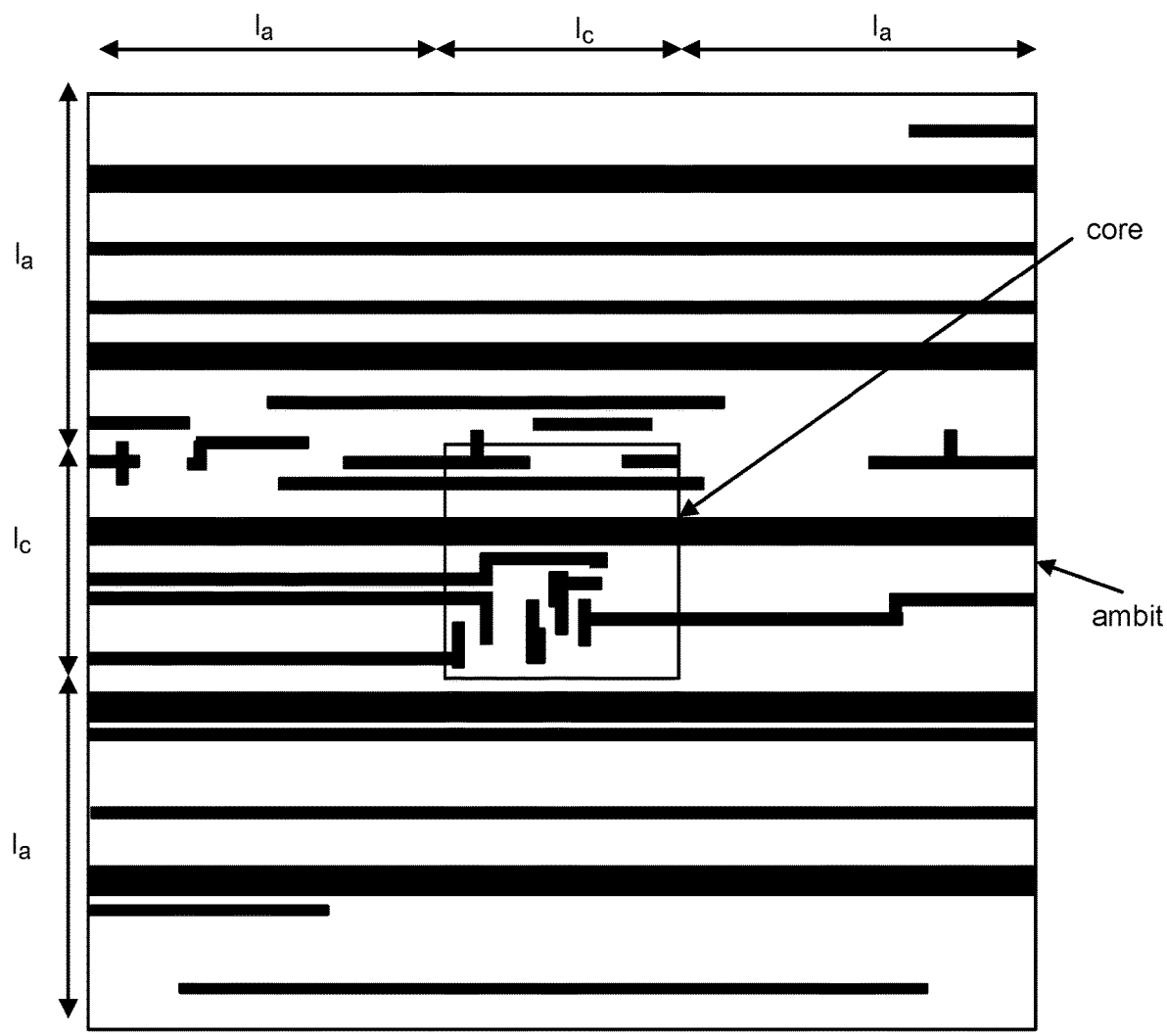
FIG. 1 is a layout clip that may contain a hotspot according to an embodiment.

FIG. 1 is a layout clip that may contain a hotspot according to an embodiment. As shown in FIG. 1, a hotspot or non-hotspot pattern in the training data set is a layout clip defined by a core and its ambit, where the core is the central part of this clip providing its significant characteristics, while the ambit is the peripheral part of this clip providing supplementary information. Additionally, the training data set, provided by foundry (or lithography simulation), may be highly imbalanced, i.e., the non-hotspot patterns greatly outnumber the hotspot patterns.

Figure 2:
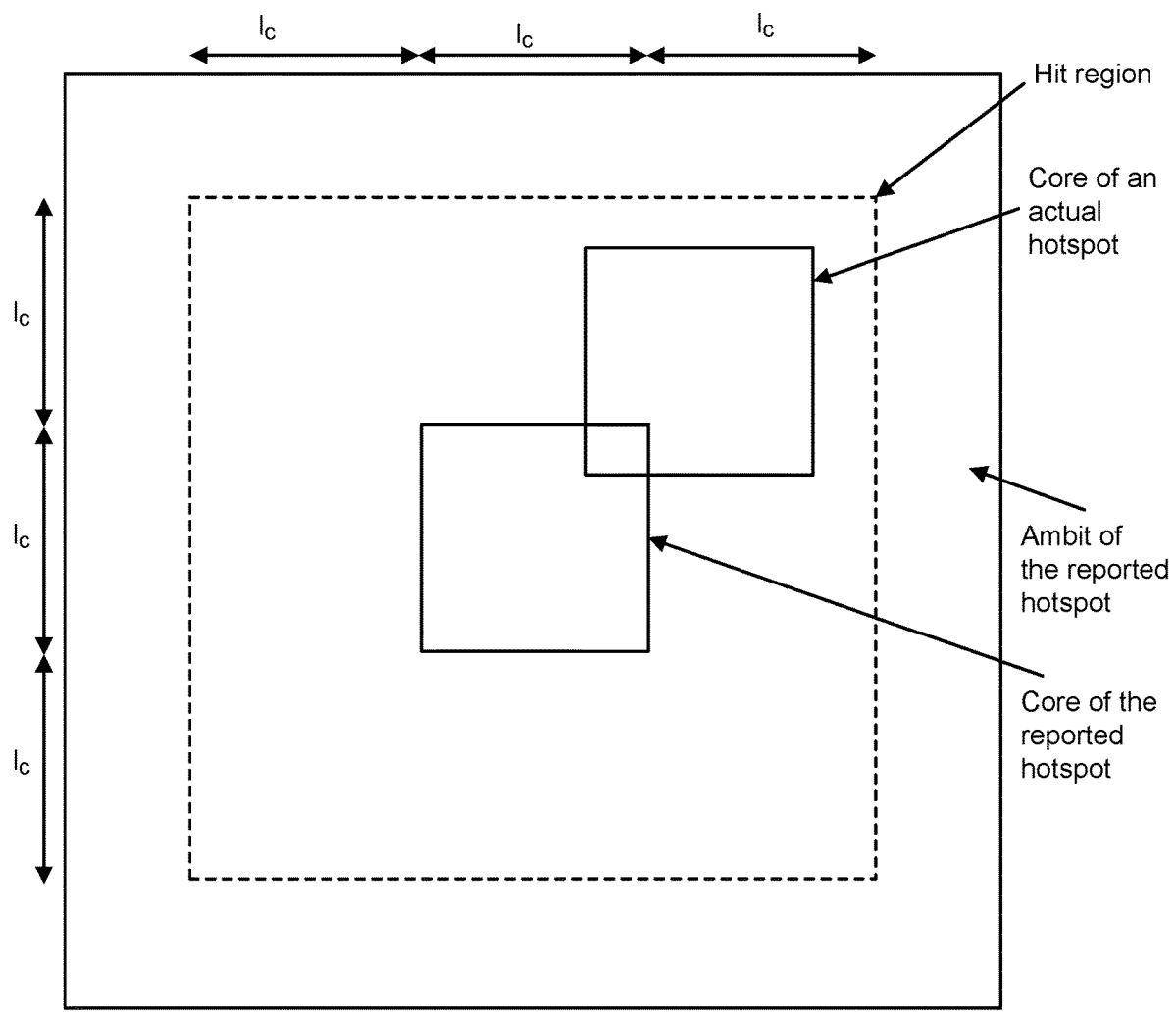
FIG. 2 is an example criteria for determining whether a reported (i.e. identified) hotspot is an actual hotspot according to an embodiment.

FIG. 2 is an example criteria for determining whether a reported (i.e. identified) hotspot is an actual hotspot according to an embodiment. As shown in FIG. 2, a reported hotspot is considered as a hit if the core of the reported hotspot overlaps with the core of an actual hotspot. In some embodiments, a hit occurs if a clip of the reported hotspot and a clip of the actual hotspot overlap a certain amount of area. Additionally, in some embodiments, a hit may occur if the clip of the reported hotspot and the clip of the actual hotspot overlap completely.

Overview

A hotspot detection system, as disclosed herein, exploits the strengths of machine learning for the identification of hotspots for a given layout. The hotspot detection system is a computing device that executes computer program modules which train the hotspot detection system to automatically identify whether part of a layout is a hotspot. A hotspot detection system might be, for example, a personal computer, a tablet computer, a laptop computer, etc. The structure of the hotspot detection system is discussed in detail below with respect to FIGS. 8 and 9.

As discussed below, the hotspot detection system uses multiple kernels to provide fuzziness thus identifying potential hotspots that are undefined in the training data set, without increasing false alarm. Additionally, the hotspot detection system balances the population between hotspot and non-hotspot samples, to achieve high accuracy and low false alarm. Additionally, a testing layout contains a tremendous number of sites that need to be evaluated to identify hotspots. Therefore, in some embodiments, in an evaluation phase, to avoid time-consuming full-layout scanning, the hotspot detection system extracts only possible layout clips based on the polygon density. In some embodiments, after evaluation, the hotspot detection system may filter the detected hotspots to reduce the possibility of false alarm without sacrificing accuracy.

Figure 3:
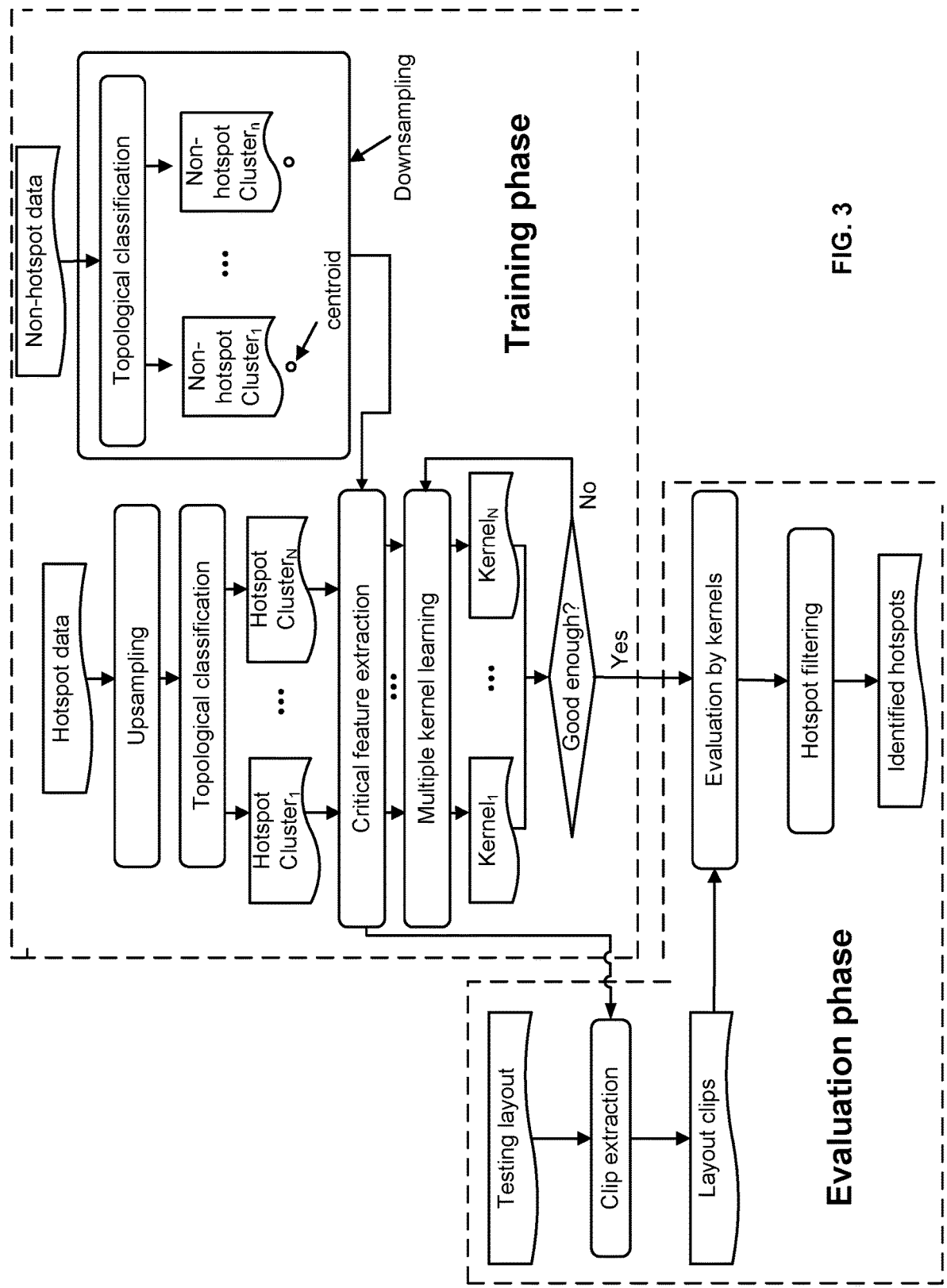
FIG. 3 is a flowchart illustrating a training phase and evaluation phase of a hotspot detection system according to an embodiment.

FIG. 3 is a flowchart illustrating a training phase and evaluation phase of a hotspot detection system according to an embodiment. The training phase constructs a machine learning multi-kernel model. The evaluation phase verifies a testing layout using the constructed multi-kernel model. Other entities may perform some or all of the steps of the process in other embodiments. Likewise, embodiments may include different and/or additional steps, or perform the steps in different orders.

The hotspot detection system is provided with a set of hotspot training data (also referred to as hotspot training data) and a set of non-hotspot training data (also referred to as non-hotspot training data). The hotspot training data contains a plurality of different patterns that are known to produce hotspots. Likewise, the non-hotspot training data contains a plurality of patterns that are known not to produce hotspots.

In one embodiment, the size of the hotspot training data is smaller than the size of the non-hotspot training data (i.e., the number of data items in the hotspot training data is less than the number of data items in the non-hotspot training data). A data item is a single pattern. Imbalanced population between hotspot and non-hotspot training data may degrade the accuracy and increase the false alarm rate, accordingly, the hotspot detection system may balance the population by upsampling or downsampling the hotspot and/or non-hotspot training data.

In this embodiment, the hotspot detection system upsamples the hotspot training data to an intermediate size. The intermediate size is the size of the data set, after upsampling, such that the upsampled hotspot training data and the non-hotspot training data are close or equal to in size. In one embodiment, the intermediate size is a size of a data set such that the ratio of the sizes of the upsampled hotspot training data set and the non-hotspot training data set is a value that may range from 1:1 to 1:40. For example, in some embodiments, the intermediate size is the size of a data set that is 1:1, i.e., the size of the hotspot training data set and the non-hotspot training data set are equal.

To upsample hotspot training data and compensate the layout clip extraction error (discussed below), the hotspot detection system slightly shifts each hotspot training pattern upwards, downwards, leftwards, rightwards, rotating the data item (e.g., 90°), moving some edge in the data item or some combination thereof, to create several derivative data items before topological classification. A derivative data item is a data shifted data item.

Additionally, the hotspot detection system downsamples the non-hotspot training data to the intermediate size. In some embodiments, to downsample non-hotspot training patterns without losing important non-hotspot information, the hotspot detection system classifies non-hotspot training data into clusters and selects the centroid of each non-hotspot cluster. After topological classification, the hotspot detection system classifies the non-hotspot patterns with the same topology into a single non-hotspot cluster. Thus, for each topology there is an associated non-hotspot cluster. Then, the hotspot detection system selects the centroid of the classified non-hotspot patterns associated with the cluster to represent the associated non-hotspot cluster. In some embodiments, the hotspot detection system discards the rest of the non-hotspot patterns within this cluster, because they have same or very similar data information as the centroid. A downsampled non-hotspot training data set is formed by all non-hotspot centroids. In alternate embodiments, the hotspot detection system may downsample (e.g., randomly select) the non-hotspot data before topological classification. However, this is not preferable as it may lose some non-hotspot training data.

In alternative embodiments, the size of the hotspot training data may be larger than the size of the non-hotspot training data. In these embodiments, the hotspot detection system may adjust (i.e., upsample or downsample) the hotspot training data and non-hotspot training such that both data sets reach the intermediate size. Additionally, in some embodiments, the hotspot training data and the non-hotspot training data may be equal in size, so no adjustment is necessary.

The hotspot detection system classifies the upsampled hotspot training data into 'N' hotspot clusters according to their topologies. Likewise, the hotspot detection system classifies the non-hotspot training data into 'n' clusters according to their topologies. Topological classification is discussed in detail below with reference to FIGS. 4A-B and 5A-E.

The hotspot detection system extracts topological and non-topological critical features from each training pattern of each hotspot cluster and from each non-hotspot centroid. Specifically, the hotspot detection system extracts topological (geometry-related) and non-topological (lithography-process-related) critical features from the data items which comprise the hotspot clusters and the downsampled non-hotspot training data set. Critical feature extraction is discussed in detail below with reference to FIGS. 6A-B.

The hotspot detection system constructs a specific kernel for each hotspot cluster using the extracted critical features of the hotspot cluster and the downsampled non-hotspot data set. In some embodiments, the kernels are constructed based on a support vector machine (SVM) model, an artificial neural network, some other machine learning model, or some combination thereof.

Each kernel is created using a hotspot cluster and all of the non-hotspot centroids. In some embodiments, each kernel is created using a hotspot cluster and a portion of the non-hotspot clusters. With topological classification, each kernel can concentrate on the critical features specific to its corresponding cluster. At the evaluation phase, a layout clip is flagged as a hotspot if one kernel classifies it as a hotspot. Topological classification also facilitates hotspot and non-hotspot population balancing. Additionally, as discussed below, compared with a single huge kernel, multiple kernel learning achieves high accuracy. The hotspot detection system may use an iterative learning process to develop the kernels to a determined training level. For example, the hotspot detection system may train the kernels until some threshold is reached (e.g., 90% accuracy in hotspot predication). Iterative multiple SVM-kernel learning is discussed in detail below.

Moreover, data shifting (that occurs in the upsampling process) generates several derivatives from the hotspot training data thus introducing adequate cluster varieties. The hotspot detection system may use data shifting to include one or more polygons that are originally located in the ambit into a core region, thus, capturing more layout information that may affect a hotspot. Additionally, in some embodiments, data shifting can also compensate possible layout clip extraction bias that is induced during clip extraction. Hence, the kernels have a flexibility to identify previously unseen patterns.

Once the kernels have reached a sufficient training level, they may be used to evaluate test layouts (i.e., the evaluation phase). A test layout is a layout which the hotspot detection system evaluates using the multiple kernels to identify hotspots.

The hotspot detection system divides a testing layout into one or more clips. In some embodiments, one or more of the clips have some portion which overlap with one or more adjacent clips. The hotspot detection system extracts one or more clips from the testing layout. In alternate embodiments, the hotspot detection system defines a clip for hotspot detection. In some instances defining a clip may include dividing a testing layout into one or more clip and extracting one or more clips from the testing layout. In some embodiments, the hotspot detection system may use some of the geometrical information extracted from the hotspot clusters and the non-hotspot clusters (e.g. the polygon density of core) to quickly identify whether the extracted layout clip is important or not. The clip extraction step reads in the testing layout and extract layout clips, then the hotspot detection system uses some geometrical information extracted from the hotspot clusters and the non-hotspot clusters to quickly abandon useless clips.

The hotspot detection system then evaluates the extracted layout clips using the trained kernels to identify hotspots. Each of the kernels is configured to identify a particular hotspot topology. In some embodiments, each of the kernels processes all of the extracted clips to identify hotspots. Additionally, in some embodiments, some discarding of known non-hotspots in the extracted clips may occur before being passed to the kernels. The identified hotspots may then be presented to a user of the hotspot detection system. For example, the hotspot detection system may present one or more cores containing hotspots (i.e. hotspot cores) to the user.

In some embodiments, the hotspot detection system may perform hotspot filtering to reduce possible redundancy in the identified hotspots. After evaluation by the kernels, the reported hotspot cores may strongly overlap in an area with high polygon density. The hotspot filtering reduces the redundancy. Moreover, the hotspot filtering can greatly reduce the false alarm without sacrificing the accuracy.

In one embodiment, the hotspot detection system merges the identified cores including hotspots (i.e., hotspot cores) into several regions, and merges a hotspot clip into an existing merging region if its core overlaps with some hotspot core of the region. A merging region is the minimum bounding box covering all hotspot cores in this region.

The hotspot detection system reframes a merging region containing more than four hotspot cores. The goal of reframing is to minimize the number of identified hotspots without missing any possible actual hotspots. Clip reframing ensures that the core of an arbitrary actual hotspot is overlapped by at least one reframed core. Additionally, the hotspot detection system may remove redundant clips located in the overlapping area of two merging regions. A hotspot core may be discarded under two conditions: (1) All polygons within this core are covered by other hotspot cores, and (2) each corner of this core overlaps with other hotspot cores inside some merging region.

Topological Classification

Some training patterns have similar shapes and some are quite different. Hence, to facilitate the subsequent machine learning kernel training, hotspot/non-hotspot patterns in the training data set are classified into clusters based on topology. After topology classification, the patterns within one cluster have very similar geometrical characteristics (critical features).

In one embodiment, the hotspot detection system uses a two-level topological classification: string-based and density-based classification. FIG. 4A illustrates four patterns A, B, C, and D according to an embodiment. String-based classification splits these patterns into two intermediate clusters {A, D} and {B, C} based on topology (e.g., B and C are both crosses).

In one embodiment, the hotspot detection system uses density-based classification on the string classified intermediate clusters to create either non-hotspot or hotspot clusters depending on the data set being processed. For example, density-based classification applied to clusters {A, D} and {B, C} is used to divide {B, C} into clusters {B} and {C}, based on their polygon distribution. FIG. 4B illustrates clusters {A, D}, {B}, and {C} according to an embodiment. Topological classification makes each machine learning kernel concentrate on the critical features specific to its corresponding cluster as well as facilitates hotspot and non-hotspot population balancing.

Figure 5A:
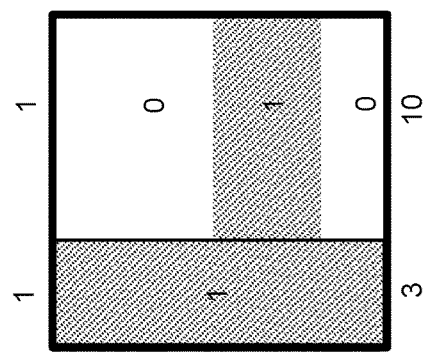
FIG. 5A is a polygon that has been sliced into different regions according to an embodiment.
Figure 5B:
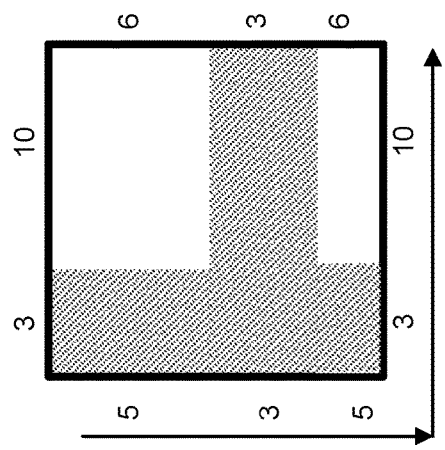
FIG. 5B is the polygon of FIG. 5A including the strings for each side according to an embodiment.

In one embodiment, the hotspot detection system uses four directional strings to capture the topology of one pattern. FIG. 5A is a polygon that has been sliced into different regions according to an embodiment. To generate a decimal string for the downward direction, the pattern is first vertically sliced along polygon edges, e.g., two slices are generated for FIG. 5A. For each slice, the boundary is labeled as "1", a polygon block is labeled as "1", and a space block is labeled as "0." Thus, each slice corresponds to a binary sequence, and then this sequence is converted to a decimal number. The downward slicing of FIG. 5A generates a string, <3, 10> (=<11$_2$, 1010$_2$>), recorded at the bottom side. FIG. 5B is the polygon of FIG. 5A including the strings for each side according to an embodiment. Any two strings recorded at adjacent sides fully capture the topology of a pattern.

In one embodiment, the hotspot detection system verifies whether two patterns have the same topology using strings from two adjacent sides of one pattern with the corresponding adjacent sides on the pattern being compared. In one embodiment, the hotspot detection system generates the four directional strings for the two patterns. The hotspot detection system selects any two strings of adjacent sides of one pattern. The hotspot detection system generates two composite strings by concatenating the strings of the other pattern counterclockwise and clockwise. The string of the beginning side should be added at the end.

Considering eight possible orientations, two patterns have the same topology if and only if any two strings at adjacent sides of one pattern exist in the counterclockwise or clockwise composite string of the other pattern. The eight possible orientations include combinations of four rotations (0°, 90°, 180°, and 270°) of the pattern and two mirror images (horizontal and vertical) of the pattern.

Figure 5C:
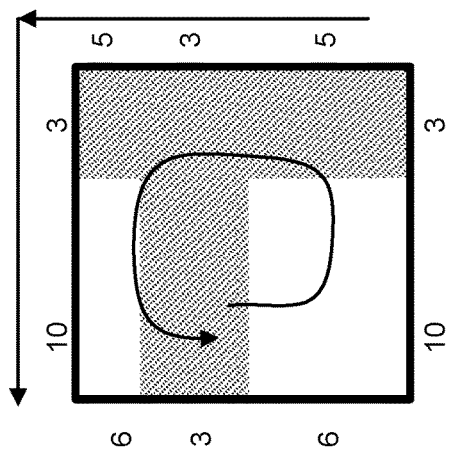
FIG. 5C illustrates a pattern including composite strings according to an embodiment.
Figure 5C:
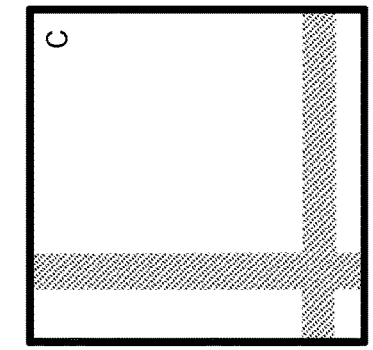

For example, in FIG. 5B the hotspot detection system selects two strings at adjacent sides of the pattern, <5, 3, 5, 3, 10> for the left and bottom sides. FIG. 5C illustrates a pattern including composite strings according to an embodiment. A counterclockwise composite string: <6, 3, 6, 10, 3, 5, 3, 5, 3, 10, 6, 3, 6>, and clockwise composite string: <10, 3, 5, 3, 5, 3, 10, 6, 3, 6, 10, 3>. The string component <5, 3, 5, 3, 10> exists in the counterclockwise composite string. Hence, two patterns given in FIGS. 5B and 5C have the same topology.

After string-based classification, patterns within one cluster have the same topology. Even so, in some cases, two patterns with the same topology may still have very different geometrical characteristics. For example, one could be a hotspot, while the other is a non-hotspot under discrete process forbidden rules.

Figure 5E:
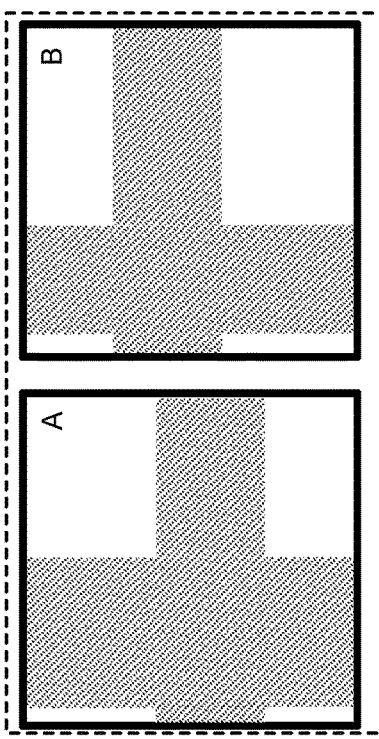
FIG. 5E illustrates two clusters, {A, B} and {C}, generated by density-based classification according to an embodiment.
Figure 5D:
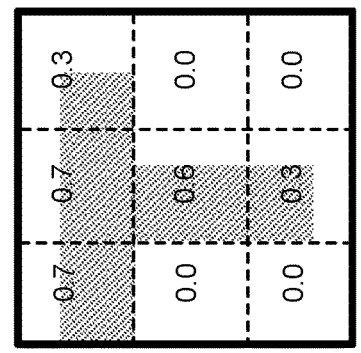
FIG. 5D illustrates a pixilated layout clip according to an embodiment.

In one embodiment, for a pattern $p_i$, its layout clip is first pixilated, and the polygon density of each pixel $d_k$ is calculated. FIG. 5D illustrates a pixilated layout clip according to an embodiment. The distance $\rho(p_i, p_j)$ between two patterns $p_i$ and $p_j$ is defined by the summation of the pixel density difference over all pixels based on the same orientation:

$$\rho(p_i,p_j)=\min_{\tau \in D_8}\Sigma_k|d_k(p_i)-d_k(\tau(p_j))|, \quad (1)$$

where $\tau$ is the orientation, and $D_8$ represents the set of eight possible orientations.

Based on the distance metric, the cluster radius used by density-based classification is defined as follows.

$$R=\max(R_0, \max_{i,j}\rho(p_i,p_j)/10), \quad (2)$$

where $R_0$ is the user-defined radius threshold. In one embodiment, for an investigated pattern, the hotspot detection system checks whether this pattern is covered by some existing cluster. For example, a pattern may be covered by a cluster if the distance between this pattern and the centroid (representative) of the cluster is less than or equal to the radius value. If so, the pattern is added into the covering cluster. Otherwise, this pattern becomes the centroid of a new cluster. This flow is repeated for all patterns. Additionally, in some embodiments, the hotspot detection system recalculates the centroid once a pattern is added to some cluster. FIG. 5E illustrates two clusters, {A, B} and {C}, generated by density-based classification according to an embodiment.

Critical Feature Extraction

The hotspot detection system extracts critical features from patterns. The critical features are features that characterize an associated pattern. Critical features may be topological or non-topological features. Topological features are related to the geometry of the pattern. Topological features may include, for example, horizontal and vertical distance between a pair of internally facing polygon edges, horizontal and vertical distance between a pair of externally facing polygon edges, diagonal distance of two convex corners, horizontal and vertical edge length of a polygon, or some other feature that is related to the geometry of the pattern. Non-topological features are related to a lithographic process that may be used to generate the pattern. Non-topological features may include, for example, a number of corners (convex plus concave), a number of touched points, a minimum distance between a pair of internally facing polygon edges, a minimum distance between a pair of externally facing polygon edges, a polygon density, or some other feature that is related to the lithographic process. In one embodiment, the hotspot detection system uses a transitive closure graph to extract the topological critical features. Critical feature extraction is further described in U.S. patent application Ser. No. 13/669,387, "Accurate Process-Hotspot Detection Using Critical Design Rule Extraction", filed on Nov. 5, 2012, which is hereby incorporated by reference in its entirety.

Figure 6A:
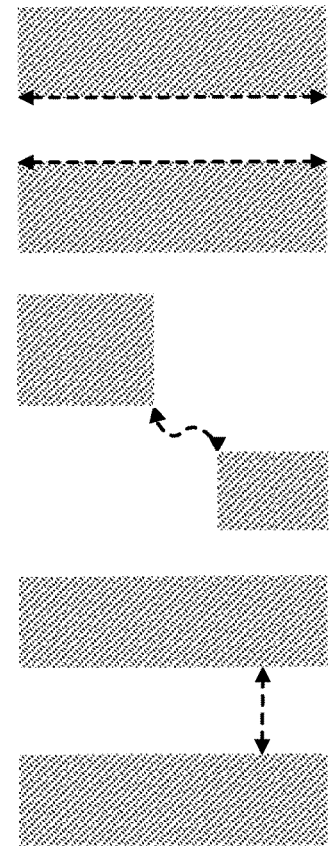
FIG. 6A illustrates four example topological features according to an embodiment.

FIG. 6A illustrates four example topological features according to an embodiment. In this embodiment, the four types of topological features extracted are: (1) horizontal and vertical distance between a pair of internally facing polygon edges; (2) horizontal and vertical distance between a pair of externally facing polygon edges; (3) diagonal distance of two convex corners; and (4) horizontal and vertical edge length of a polygon. Considering eight possible orientations, two sets of topological features may be generated to preserve the vertical and horizontal relationships among extracted features.

Figure 6B:
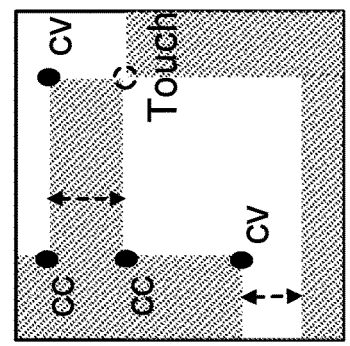
FIG. 6B illustrates five example non-topological features according to an embodiment.

FIG. 6B illustrates five example non-topological features according to an embodiment. In this embodiment, the hotspot detection system defines five types of non-topological features: (1) the number of corners (convex plus concave); (2) the number of touched points; (3) the minimum distance between a pair of internally facing polygon edges; (4) the minimum distance between a pair of externally facing polygon edges; and (5) the polygon density.

By topological classification, the number of critical features is identical for all patterns in a cluster. The equivalent feature number facilitates the subsequent SVM kernel training. For example, in an SVM training step, a kernel may be trained using a large amount of data. But, only with a fixed data feature size, a kernel can be trained. If two of the training data contain different feature sizes some method (e.g., add dummy features to the one with fewer features size or discard some features of the one with greater features size) should be used to make them equal. Thus, lowering the kernel training quality, because it is not known what features are really important.

Iterative Multiple SVM-Kernel Learning

To provide the flexibility to identify unseen hotspots, the hotspot detection system leverages machine learning. As discussed above, in some embodiments, the hotspot detection system may use iterative multiple kernel learning to fully exploit the strengths of machine learning.

In machine learning, SVM is a popular supervised learning model. A two-class SVM transforms the training data to a high dimensional space and calculates a hyperplane to separate the data into two classes with a maximum margin. If the SVM kernel function is a symmetric positive semi-definite function, then SVM guarantees a global optimum solution. SVM has showed superior performance in handling a small training data set, non-linear and high dimensional classification issues.

In one embodiment, the hotspot detection system uses two-class soft-margin C-type SVM and uses the radial basis function to develop the kernels to detect hotspots and non-hotspots. Given training data $x_n$, n=1 ... N, with label to (+1 or −1 for two-class SVM). The dual form of the quadratic programming formulation of C-type SVM is given as follows.

$$\max f(a) = \sum_{n=1}^{N} a_n - \frac{1}{2} \sum_{n=1}^{N} \sum_{m=1}^{N} a_n a_m t_n t_m k(x_n, x_m) \quad (3)$$

subject to $$0 \leq a_n \leq C, \forall n=1 \ldots N, \quad (4)$$

$$\sum_{n=1}^{N} a_n t_n = 0, \quad (5)$$

$$k(x_n, x_m) = e^{(-\gamma \|x_n - x_m\|^2)}, \quad (6)$$

$$a = (a_1, \ldots, a_N)^T, \quad (7)$$

where C controls the trade-off between the slack variable penalty and the margin, $k(x_n, x_m)$ is the Gaussian radial basis kernel function, and $a_n$ is the Lagrange multiplier. The Gaussian radial basis kernel function is symmetric positive semi-definite thus leading to an optimal classification. In this embodiment, an imbalanced population may destroy the soft margin and degrade the training quality.

Appropriate values of C and γ may result in a good training quality of an SVM kernel. Therefore, as shown in FIG. 3, the hotspot detection system uses a self-training process to iteratively adapt C and γ parameters. The initial values of C and γ are 1000 and 0.01, respectively. C and γ are doubled if the stopping criterion is not satisfied. The stopping criterion of iterative learning is that the number of self-training iterations exceeds a user-defined bound or the hotspot/non-hotspot detection accuracy rate (with respect to the training data) exceeds a user-defined training accuracy, say 90%, or some other value.

Layout Clip Extraction

A testing layout contains a tremendous number of sites that need to be evaluated. In one embodiment, to avoid time-consuming full-layout scanning, the hotspot detection system may extract only possible layout clips based on the polygon distribution. In other embodiments, the hotspot detection system may extract additional layout clips.

Figure 7B:
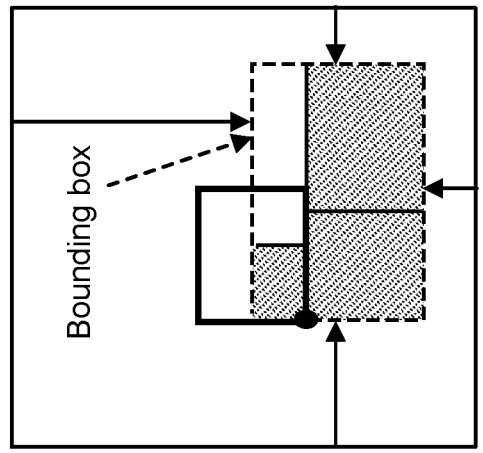
FIG. 7B illustrates a layout clip including the polygon in FIG. 7A according to an embodiment.
Figure 7A:
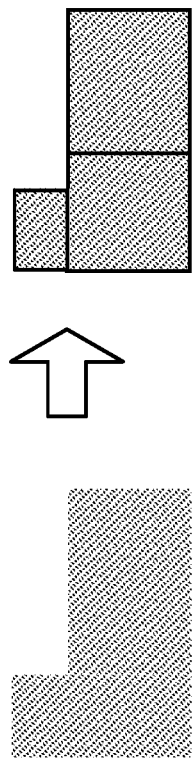
FIG. 7A illustrates polygon dissection occurring during layout clip extraction according to an embodiment.

FIG. 7A illustrates polygon dissection occurring during layout clip extraction according to an embodiment. In this embodiment, each layout polygon is first horizontally sliced into rectangles. The rectangles are then cut into smaller pieces if their widths or heights are greater than the hotspot core side length ($I_c$ in FIG. 2).

FIG. 7B illustrates a layout clip including the polygon in FIG. 7A according to an embodiment. As shown in FIG. 7B, a core and an ambit are set with respect to the bottom left corner of each rectangle. The hotspot detection system extracts the corresponding layout clip if the polygon distribution within this clip meets the user-specified requirements; otherwise, the clip is discarded. In some embodiments, the user specified requirements may specify a polygon density (total polygon area/clip area), a polygon count, distances between the clip boundary and the bounding box that covers all polygon rectangles in the clip, etc. For example, the polygon density may be at least or equal to 0.3, the polygon count may be greater than 5, and distances between the clip boundary and the bounding box that covers all polygon rectangles in the clip may be shorter than 35% of the hotspot ambit length. The polygon distribution may be a polygon density, a polygon count, a distances between the clip boundary and the bounding box that covers all polygon rectangles in the clip (indicated by four arrows in FIG. 7B), etc. The user-specified requirements are positively correlated to the information of hotspot training data. It can be seen that if the polygon distribution requirements are met, each polygon must be included by at least one layout clip. Moreover, the possible misalignment between an extracted clip and an actual hotspot can be compensated by data shifting that occurs during population balancing.

Experimental Results

In one embodiment, the hotspot detection system may include software modules implemented in the C++ programming language with a GDSII library Anuvad and the SVM library LIBSVM. In this embodiment, the hotspot detection system includes two Intel Xeon 2.3 GHz CPUs and with 64 GB memory.

Experiments were conducted on six 32 nm and 28 nm industrial designs released by J. A. Torres, ICCAD-2012 CAD contest in fuzzy pattern matching for physical verification and benchmark suite, In Proc. ICCAD, pp. 349-350, 2012, http://cad_contest.cs.nctu.edu.tw/CAD-contest-at-ICCAD2012/problems/p3/p3.html, as listed in Table 1, with a highly imbalanced population between hotspot and non-hotspot training patterns. #hs means number of hotspots, while #nhs means number of non-hotspots. The core size is 1.2×1.2 um$^2$, while the clip size is 4.8×4.8 um$^2$ for this benchmark suite. Three sets of experiments were performed to compare the overall performance of the hotspot detection system with the 2012 CAD contest winners, demonstrate the effectiveness of a multiple SVM kernel training and hotspot filtering, and show rapid training convergence of the hotspot detection system.

In the second set of experiments, as listed in Table 3, the effectiveness of the hotspot detection system is demonstrated. 'Single SVM' means the baseline SVM which uses one single huge SVM kernel (i.e., without topological classification and hotspot filtering); 'ours_wo_filtering' means the hotspot detection system using multiple SVM kernel training without hotspot filtering (i.e., with topological classification but without hotspot filtering); 'ours' means the hotspot detection system including hotspot filtering. In the experiments, the following parameters are used to demonstrate the flow of the hotspot detection system: (1) the respective initial values of C and γ of the hotspot detection system's SVM kernel are 1000 and 0.01; (2) the stopping criterion of self-training is 90% accuracy; (3) data shifting is 120 nm (=$I_c$/10); (4) the maximum distance between the clip boundary and the bounding box of clip extraction is 1440 nm; (5) the minimum overlapping of clip merging is 20%; and (6) the separating distance of core reframing is 1150 nm. First of all, the hotspot detection system's critical features are effective. For example, a single SVM achieves over 78% accuracy for Array_benchmark3 and Array_benchmark5. Secondly, the hotspot detection system topological classification and population balancing work well, and thus the hotspot detection system's multiple SVM kernel learning

TABLE 1

1012 CAD Contest at ICCAD Benchmark Statistics

| Training data | | | Testing Layout | | |
|---|---|---|---|---|---|
| Name | #hs | #nhs | Name | #hs | area (um$^2$) | process |
| MX_benchmark1_clip | 99 | 340 | Array_Benchmark1 | 226 | 12516 | 32 nm |
| MX_benchmark2_clip | 176 | 5285 | Array_Benchmark2 | 499 | 106954 | 28 nm |
| MX_benchmark3_clip | 923 | 4643 | Array_Benchmark3 | 1847 | 122565 | 28 nm |
| MX_benchmark4_clip | 98 | 4452 | Array_Benchmark4 | 192 | 82010 | 28 nm |
| MX_benchmark5_clip | 26 | 2716 | Array_Benchmark5 | 42 | 49583 | 28 nm |
| | | | MX_blind_partial | 55 | 224975 | 32 nm |

In the first set of experiments, the hotspot detection system is compared with the 2012 CAD contest winners at ICCAD. Table 2 summarizes the experimental results. Overall, the hotspot detection system outperforms the first place winner on accuracy, false alarm, and the hit/extra rate. For the Array_benchmark3, compared with the third place winner, the hotspot detection system has lower accuracy but with a significantly lower false alarm.

TABLE 2

Comparison with 2012 CAD Contest Winners

| Testing Layout (Training Data) | Methods | #hit | #extra | accuracy | hit/extra | Runtime |
|---|---|---|---|---|---|---|
| Array_Benchmark1 | 1$^{st}$ place | 212 | 1826 | 93.81% | 1.16E-01 | 0 m 05.1 s |
| (MX_benchmark1_clip) | 2$^{nd}$ place | 98 | 188 | 43.36% | 5.21E-01 | 1 m 50.2 s |
| | 3$^{rd}$ place | 157 | 728 | 69.47% | 2.16E-01 | 0 m 06.7 s |
| | Hotspot Det. Sys. | 214 | 1493 | 94.69% | 1.43E-01 | 0 m 38.1 s |
| Array_Benchmark2 | 1$^{st}$ place | 489 | 20383 | 98.00% | 2.40E-02 | 8 m 11.9 s |
| (MX_benchmark2_clip) | 2$^{nd}$ place | 108 | 548 | 21.64% | 1.97E-01 | 23 m 40.8 s |
| | 3$^{rd}$ place | 337 | 5878 | 67.54% | 5.73E-02 | 6 m 10.2 s |
| | Hotspot Det. Sys. | 490 | 11834 | 98.20% | 4.14E-02 | 3 m 54.4 s |
| Array_Benchmark3 | 1$^{st}$ place | 1696 | 20764 | 91.82% | 8.17E-02 | 18 m 44.00 s |
| (MX_benchmark3_clip) | 2$^{nd}$ place | 1491 | 9579 | 80.73% | 1.56E-01 | 118 m 56.8 s |
| | 3$^{rd}$ place | 1840 | 71328 | 99.62% | 2.58E-02 | 7 m 58.1 s |
| | Hotspot Det. Sys. | 1697 | 13850 | 91.88% | 1.23E-01 | 14 m 57.7 s |
| Array_Benchmark4 | 1$^{st}$ place | 161 | 3726 | 83.85% | 4.32E-02 | 1 m 15.9 s |
| (MX_benchmark4_clip) | 2$^{nd}$ place | 124 | 956 | 64.58% | 1.30E-01 | 21 m 57.9 s |
| | 3$^{rd}$ place | 152 | 13582 | 79.17% | 1.14E-02 | 1 m 42.9 s |
| | Hotspot Det. Sys. | 165 | 3664 | 85.94% | 4.50E-02 | 5 m 56.3 s |
| Array_Benchmark5 | 1$^{st}$ place | 39 | 2014 | 92.86% | 1.94E-02 | 0 m 26.6 s |
| (MX_benchmark5_clip) | 2$^{nd}$ place | 26 | 31 | 61.90% | 8.39E-01 | 5 m 25.6 s |
| | 3$^{rd}$ place | 20 | 245 | 47.62% | 8.16E-02 | 0 m 40.0 s |
| | Hotspot Det. Sys. | 39 | 1205 | 92.86% | 3.24E-02 | 0 m 20.0 s | has adequate fuzziness and delivers very high accuracy, 85.9~98.2%. Thirdly, the hotspot detection system's hotspot filtering greatly reduces the false alarm for all cases without sacrificing accuracy.

TABLE 3

Detailed Comparison of Hotspot Detection Features

| Testing Layout (Training Data) | Methods | #hit | #extra | accuracy | Runtime |
|---|---|---|---|---|---|
| Array_Benchmark1 | 1$^{st}$ place | 212 | 1826 | 93.81% | 0 m 05.1 s |
| (MX_benchmark1_clip) | Single SVM | 164 | 1126 | 72.57% | 0 m 02.7 s |
| | Hotspot Det. Sys. w/o filtering | 214 | 2729 | 94.69% | 0 m 37.0 s |
| | Hotspot Det. Sys. | 214 | 1493 | 94.69% | 0 m 38.1 s |
| Array_Benchmark2 | 1$^{st}$ place | 489 | 20383 | 98.00% | 8 m 11.9 s |
| (MX_benchmark2_clip) | Single SVM | 288 | 2828 | 57.72% | 3 m 42.9 s |
| | Hotspot Det. Sys. w/o filtering | 490 | 22775 | 98.20% | 3 m 22.0 s |
| | Hotspot Det. Sys. | 490 | 11834 | 98.20% | 3 m 54.4 s |
| Array_Benchmark3 | 1$^{st}$ place | 1696 | 20764 | 91.82% | 18 m 44.0 s |
| (MX_benchmark3_clip) | Single SVM | 1600 | 31811 | 86.63% | 7 m 42.8 s |
| | Hotspot Det. Sys. w/o filtering | 1697 | 51067 | 91.88% | 13 m 34.2 s |
| | Hotspot Det. Sys. | 1697 | 13850 | 91.88% | 14 m 57.7 s |
| Array_Benchmark4 | 1$^{st}$ place | 161 | 3726 | 83.85% | 1 m 15.9 s |
| (MX_benchmark4_clip) | Single SVM | 119 | 1388 | 61.98% | 0 m 26.7 s |
| | Hotspot Det. Sys. w/o filtering | 165 | 5936 | 85.94% | 5 m 52.4 s |
| | Hotspot Det. Sys. | 165 | 3664 | 85.94% | 5 m 56.3 s |
| Array_Benchmark5 | 1$^{st}$ place | 39 | 2014 | 92.86% | 0 m 26.6 s |
| (MX_benchmark5_clip) | Single SVM | 33 | 1227 | 78.57% | 0 m 13.0 s |
| | Hotspot Det. Sys. w/o filtering | 39 | 2136 | 92.86% | 0 m 18.9 s |
| | Hotspot Det. Sys. | 39 | 1205 | 92.86% | 0 m 20.0 s |
| MX_blind partial | 1$^{st}$ place | 51 | 66818 | 92.73% | 2 m 31.7 s |
| (MX_benchmark1_clip) | Single SVM | 38 | 31148 | 69.09% | 1 m 18.1 s |
| | Hotspot Det. Sys. w/o filtering | 51 | 89254 | 92.73% | 2 m 59.7 s |
| | Hotspot Det. Sys. | 51 | 55080 | 92.73% | 5 m 04.6 s |

In the third set of experiments, the impact of training data on accuracy is shown in Table 4. For this table, 'data' refers the ratio of the used training pattern count over the whole training pattern count. Table 4 indicates that using different training data may achieve higher accuracy and lower false alarm, e.g., Array_benchmark2 and MX_blind_partial. Secondly, there is a rapid convergence of training quality for the hotspot detection system. Additionally, the hotspot detection system may use a small amount of training data to achieve high accuracy, especially for Array_benchmark3 and Array_benchmark5, thus shortening the runtime.

Figure 8:
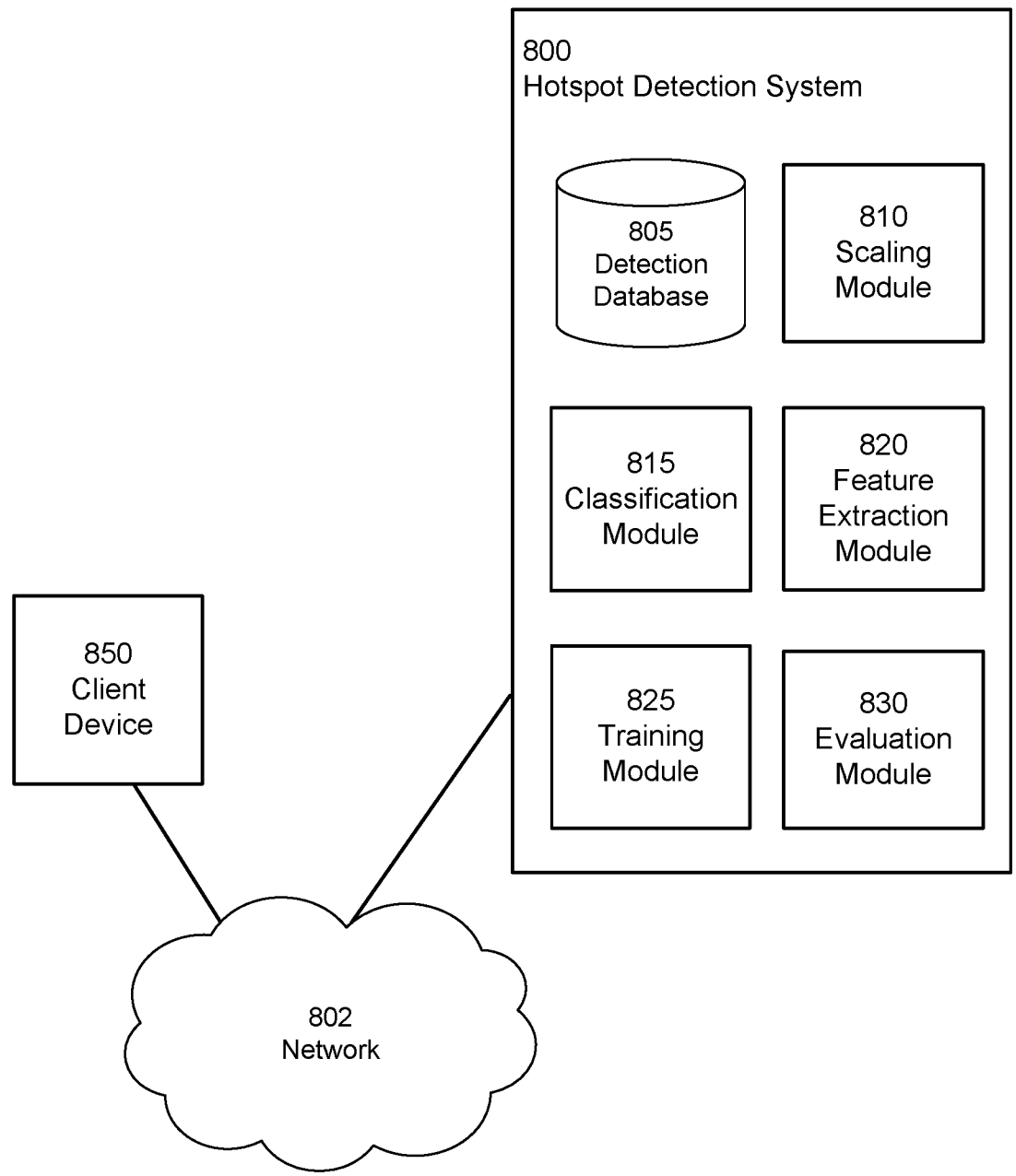
FIG. 8 is a high-level block diagram illustrating an embodiment of an environment for hotspot spot detection.
Figure 9:
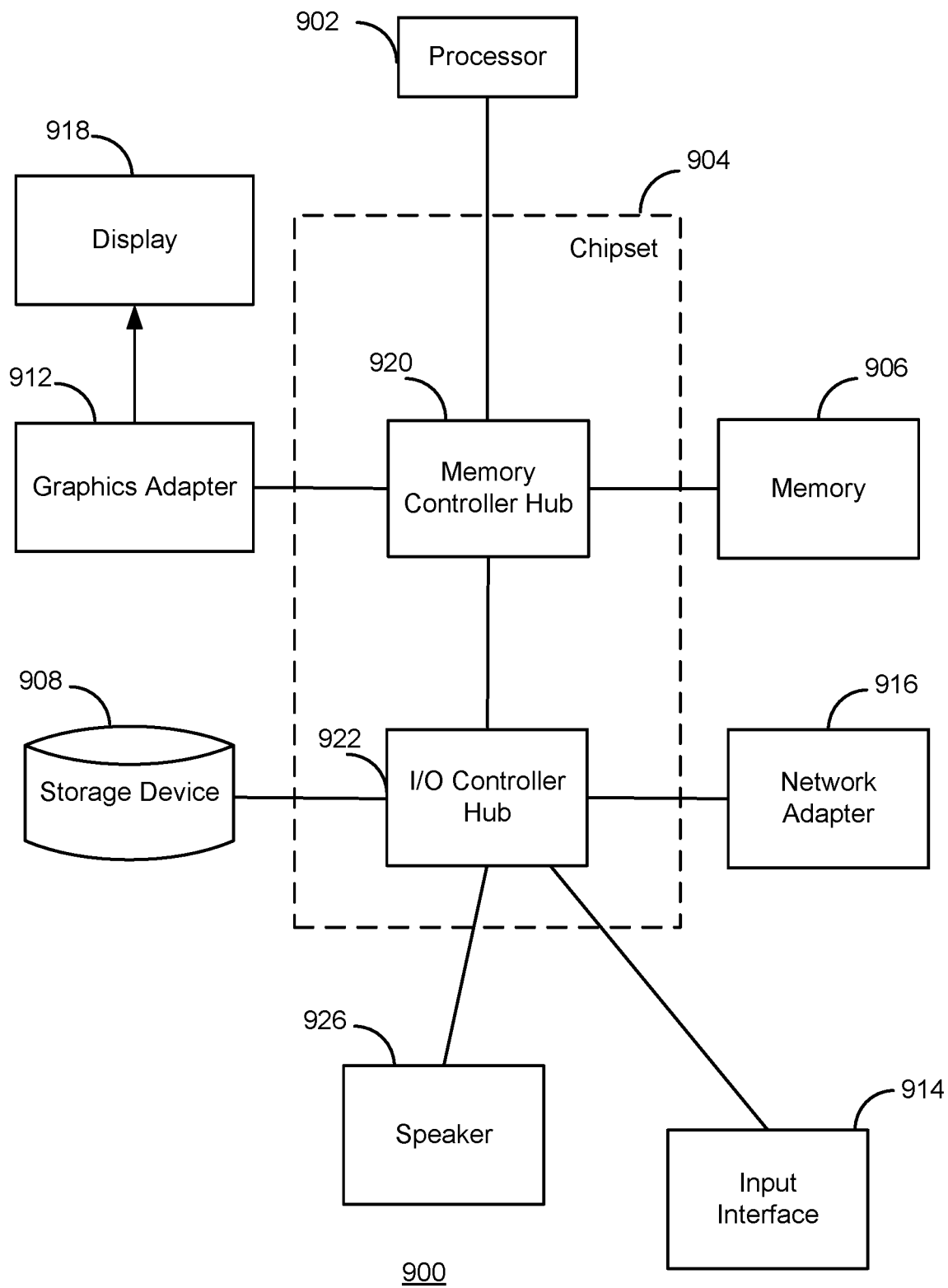
FIG. 9 is a block diagram illustrating a detailed view of the components within a hotspot detection system according to an embodiment

FIG. 8 is a high-level block diagram illustrating an embodiment of an environment for hotspot spot detection. The environment includes a client device 100 connected by a network 802 to a hotspot detection system 800. Here only one client device 100 and hotspot detection system are illustrated, but there may be multiple instances of each of these entities. For example, there may be hundreds of user devices 100 in communication with multiple hotspot detection systems 800.

The network 802 provides a communication infrastructure between the user device 100 and the hotspot detection system 800. The network 802 is typically the Internet, but may be any network, including but not limited to a Local Area Network (LAN), a Metropolitan Area Network (MAN), a Wide Area Network (WAN), a mobile wired or

TABLE 4

Accuracy and Training Data

| Testing Layout (Training Data) | Methods | Data | #hit | #extra | accuracy | Runtime |
|---|---|---|---|---|---|---|
| Array_Benchmark1 | 1$^{st}$ place | 100.0% | 212 | 1826 | 93.81% | 0 m 05.1 s |
| (MX_benchmark1_clip) | Hotspot Det. Sys. | 75.0% | 214 | 1476 | 94.69% | 0 m 54.1 s |
| Array_Benchmark2 | 1$^{st}$ place | 100.0% | 489 | 20383 | 98.00% | 8 m 11.9 s |
| (MX_benchmark2_clip) | Hotspot Det. Sys. | 0.6% | 494 | 18.256 | 99.00% | 4 m 16.5 s |
| Array_Benchmark3 | 1$^{st}$ place | 100.0% | 1696 | 20764 | 91.82% | 18 m 44.0 s |
| (MX_benchmark3_clip) | Hotspot Det. Sys. | 1.0% | 1712 | 16565 | 92.69% | 6 m 09.0 s |
| Array_Benchmark4 | 1$^{st}$ place | 100.0% | 161 | 3726 | 83.85% | 1 m 15.9 s |
| (MX_benchmark4_clip) | Hotspot Det. Sys. | 97.0% | 164 | 2946 | 85.42% | 1 m 15.2 s |
| Array_Benchmark5 | 1$^{st}$ place | 100.0% | 39 | 2014 | 92.86% | 0 m 26.6 s |
| (MX_benchmark5_clip) | Hotspot Det. Sys. | 95.0% | 40 | 1320 | 95.24% | 0 m 19.3 s |
| MX_blind_partial | 1$^{st}$ place | 100.0% | 50 | 49223 | 90.91% | 15 m 04.9 s |
| (MX_benchmark1_clip) | Hotspot Det. Sys. | 100.0% | 52 | 43810 | 94.55% | 15 m 05.8 s | wireless network, a private network, a virtual private network, or some combination thereof.

The client device 850 is a computing device that executes computer program modules that allow a user to upload data to the hotspot detection system 800. For example, in some embodiments, the client device 850 uploads a layout for an integrated circuit to the hotspot detection system 800. Additionally, the modules allow a user to receive identified hotspots or some other information from the hotspot detection system 800. The client device 850 might be, for example, a personal computer, a tablet computer, a laptop computer, or other type of network-capable device.

The hotspot detection system 800 processes layouts to identify one or more hotspots. In some embodiments, a user uploads a layout directly from a user, processes the layout to identify hotspots, and presents the identified hotspots to the user. In alternate embodiments, the hotspot detection system 800 receives layouts from the client device 850, processes the layout to identify hotspots, and provides the identified hotspots to the client device 850.

The hotspot detection system 800 is comprised of modules including a detection database 805, a scaling module 810, a classification module 815, a feature extraction module 820, a training module 825 and an evaluation module 830. Some embodiments of the hotspot detection system 800 have different modules than those described here. Similarly, the functions can be distributed among the modules in a different manner than is described here. In some embodiments, the hotspot detection system 800 is configured to perform some or all of the functions described above with reference to FIG. 3.

The detection database 805 is a database including hotspot training data, non-hotspot training data, one or more testing layouts, one or more clips, or some combination thereof. As discussed with reference to FIG. 3 above, the hotspot training data contains a plurality of different patterns that are known to produce hotspots. Likewise, the non-hotspot training data contains a plurality of patterns that are known not to produce hotspots.

The scaling module 810 scales non-hotspot training data, hotspot training data, or some combination thereof. The scaling module 810 may retrieve non-hotspot training data and/or hotspot training data from the detection database 805 and/or some other entity (e.g., system administrator). In some embodiments, the scaling module 810 is configured to upsample and/or downsample the hotspot training data, the non-hotspot training data, or some combination thereof. For example, the scaling module 810 may upsample the hotspot training data to an intermediate size (e.g., such that the hotspot training data set and the non-hotspot training data set are equal size). In some embodiments, the scaling module 810 may upsample the hotspot training data and/or the non-hotspot training data by slightly shifting (e.g., upwards, downwards, leftwards, rightwards, rotating the data item, moving some edge in the data item, or some combination thereof) each data item, and storing the newly shifted data item as a separate data item in the upsampled hotspot training data and/or non-hotspot training data.

In some embodiments, the scaling module 810 is configured to downsample the hotspot training data, the non-hotspot training data, or some combination thereof. For example, the scaling module 810 may filter out duplicative patterns in the training data. The scaling module 810 is configured to provide the scaled training data to the classification module 815. Scaled training data may be the hotspot training data and/or the non-hotspot training data, that has been upsampled, downsampled, not modified (e.g., no upsampling/downsampling of the data), or some combination thereof.

The classification module 815 classifies training data according to its topologies. The classification module 815 receives the hotspot training data, non-hotspot training data, or some combination thereof from the scaling module 810. The hotspot training data and/or non-hotspot training may or may not have been scaled (e.g., upsampled and/or downsampled). The classification module 815 classifies hotspot training data into 'N' hotspot clusters according to their topologies. Likewise, the classification module 815 classifies the non-hotspot training data into 'n' non-hotspot clusters according to their topologies. The classification module 815 groups non-hotspot patterns with the same topology into a single non-hotspot cluster. Thus, for each topology, there is an associated non-hotspot cluster. The classification module 815 selects the centroid of the classified non-hotspot patterns associated with the cluster to represent the associated non-hotspot cluster. In some embodiments, the classification module 815 discards (e.g., using the scaling module 810) the rest of the non-hotspot patterns within this cluster, because they have same or very similar data information as the centroid. In alternate embodiments, the classification module 810 may downsample (e.g., randomly select) the non-hotspot data before topological classification. In some embodiments, the classification module 815 performs some or all of the functions discussed in detail above in the section titled "Topological Classification" to classify the hotspot training data, non-hotspot training data, or some combination thereof. The classification module 815 provides the hotspot clusters and non-hotspot clusters to the feature extraction module 820.

The feature extraction module 820 extracts critical features from hotspot clusters, non-hotspot clusters, or some combination thereof. The critical features may be topological and/or non-topological. The feature extraction module 820 performs some or all of the functions discussed in detail above in the section titled "Critical Feature Extraction" to extract critical features from the hotspot training data, non-hotspot training data, or some combination thereof. The feature extraction module 820 provides the critical features to the training module 825.

The training module 825 creates a plurality of kernels configured to identify hotspots using the critical features received from the feature extraction module 820. The training module 825 creates a kernel for each hotspot cluster using the extracted critical features of the hotspot cluster and the critical features extracted from some, or all of, the non-hotspot training data. The kernels may be constructed based on a SVM model, an artificial neural network, some other machine learning model, or some combination thereof.

The training module 825 may train kernels to a determined training level. The training module 825 may use an iterative training process that trains kernels until a threshold value is reached. The threshold value may be set such that the training completes when one or more parameters are achieved. A parameter may be, e.g., a hotspot detection accuracy rate, time take, number of training cycles, etc. The training module 825 performs some or all of the functions discussed in detail above in the section titled "Iterative Multiple SVM-Kernel Learning" to train the kernels for hotspot detection.

The evaluation module 830 generates one or more clips from a testing layout. The testing layout may be received from a user of the hotspot detection system 800, received from one or more client devices 100, or some combination thereof. The evaluation module 830 may retrieve the testing layout from the detection database 805. The evaluation module 830 performs some or all of the functions discussed in detail above in the section titled "Layout Clip Extraction" to extract clips from a testing layout. In some embodiments, the evaluation module 830 uses some, or all of, the geometrical information extracted from the hotspot clusters and/or the non-hotspot clusters to identify whether an extracted layout clip is likely to contain a hotspot. Additionally, in some embodiments, if the clip includes patterns that are known not to be hotspots, the evaluation module 830 discards the clip.

The evaluation module 830 then evaluates clips using the trained kernels to identify hotspot cores. Each of the trained kernels is configured to identify a particular hotspot topology. The evaluation module 830 uses some or all of the trained kernels to identify hotspot cores in the clips. In some embodiments, the evaluation module 830 may filter out any redundancy in the identified hotspot cores Additionally, the evaluation module 830 may merge a plurality of hotspot cores into a merging region (i.e., the minimum bounding box covering all hotspot cores in a region) if the hotspot cores overlap. In some embodiments, the evaluation module 830 may reframe a merging region containing a plurality of hotspot cores (e.g., more than 4). This is discussed above with reference to FIG. 3. The evaluation module 830 may present the identified hotspots to the user and/or provide the identified hotspots to the client device 100.

Turning now to a discussion of the implementation of the entities discussed above, FIG. 9 is a high-level block diagram illustrating an example computer 900 for implementing one or more of the entities shown in FIG. 8. The computer 900 includes at least one processor 902 coupled to a chipset 904. The chipset 904 includes a memory controller hub 920 and an input/output (I/O) controller hub 922. A memory 906 and a graphics adapter 912 are coupled to the memory controller hub 920, and a display 918 is coupled to the graphics adapter 912. A storage device 908, an input interface 914, a speaker 926, and network adapter 916 are coupled to the I/O controller hub 922. Other embodiments of the computer 900 have different architectures.

The storage device 908 is a non-transitory computer-readable storage medium such as a hard drive, compact disk read-only memory (CD-ROM), DVD, or a solid-state memory device. The memory 906 holds instructions and data used by the processor 902. The input interface 914 is a touch-screen interface, a mouse, track ball, or other type of pointing device, a keyboard, a microphone, or some combination thereof, and is used to input data into the computer 900. The graphics adapter 912 displays images and other information on the display 918. The network adapter 916 couples the computer 900 to one or more computer networks.

The computer 900 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 908, loaded into the memory 906, and executed by the processor 902. The type of computer 900 used by the hotspot detection system 800 can vary depending upon the embodiment and the processing power required by the hotspot detection system 800. For example, the hotspot detection system 800 may include multiple computers 900 communicating with each other through a network such as in a server farm to provide the functionality described herein. Such computers 900 may lack some of the components described above, such as graphics adapters 912 and displays 918.

Additional Configuration Considerations

Some portions of the above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof. In one embodiment, a software module is implemented with a computer program product comprising a non-transitory computer-readable medium containing computer program code, which can be executed by a computer processor for performing any or all of the steps, operations, or processes described.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for identifying hotspots. Thus, while particular embodiments and applications have been illustrated and described, it is to be understood that the described subject matter is not limited to the precise construction and components disclosed herein and that various modifications, changes and variations which will be apparent to those skilled in the art may be made in the arrangement, operation and details of the method and apparatus disclosed herein.

The invention claimed is:

1. A method comprising:
classifying, into a first plurality of clusters, a first set of training data including a plurality of failure-inducing patterns, each cluster in the first plurality of clusters including a respective subset of the failure-inducing patterns having a respective failure-inducing topology;
classifying, into a second plurality of clusters, a second set of training data including a plurality of patterns that do not induce circuit failures, each cluster in the second plurality of clusters including a respective subset of the patterns having a respective topology;
selecting a plurality of representative patterns from the plurality of patterns classified into the second plurality of clusters, each representative pattern represents a respective cluster in the second plurality of clusters;
extracting a respective plurality of features from each cluster in the first plurality of clusters and from the plurality of representative patterns; and
training each kernel of a plurality of kernels using the respective extracted features to identify the respective failure-inducing topology in a circuit, wherein each of the trained kernels identifies the respective failure-inducing topology different from a failure-inducing topology that another kernel of the plurality of kernels identifies.

2. The method of claim 1, wherein the plurality of failure-inducing patterns includes a plurality of hotspot patterns, and each cluster in the first plurality of clusters includes a subset of the hotspot patterns having a unique hotspot topology.

3. The method of claim 1, further comprising:
upsampling failure-inducing training data to the first set of training data having a first data size that is based on a second data size of the second set of training data.

4. The method of claim 3, further comprising:
upsampling the failure-inducing training data by shifting at least a portion of a failure-inducing training pattern of the failure-inducing training data along at least one axis to generate at least two of the failure-inducing patterns.

5. The method of claim 1, further comprising:
classifying the first set of training data into a plurality of intermediate failure-inducing clusters using string-based classification; and
creating at least one cluster in the first plurality of clusters from each intermediate failure-inducing cluster using density-based classification.

6. The method of claim 1, wherein the patterns that do not induce circuit failures include a plurality of non-hotspot patterns, and each cluster in the second plurality of clusters includes a subset of the non-hotspot patterns having a unique non-hotspot topology.

7. The method of claim 1, further comprising:
classifying the second set of training data into a plurality of intermediate clusters using string-based classification; and
creating at least one cluster in the second plurality of clusters from each intermediate cluster using density-based classification.

8. The method of claim 1, further comprising:
selecting each representative pattern as a centroid of the respective cluster in the second plurality of clusters.

9. The method of claim 1, further comprising:
extracting the respective plurality of features from each cluster in the first plurality of clusters and from a plurality of centroids of the second plurality of clusters.

10. The method of claim 1, wherein the respective extracted features comprise a plurality of topological critical features and a plurality of non-topological critical features.

11. The method of claim 10, wherein the topological critical features are geometry-related critical features and the non-topological critical features are lithography-process-related critical features.

12. The method of claim 1, further comprising:
training each kernel by applying an iterative support vector machine (SVM) learning algorithm on the respective extracted features.

13. The method of claim 1, further comprising:
training the plurality of kernels in an iterative manner until a stopping criterion is satisfied, the stopping criterion being an accuracy rate for detecting a failure-inducing topology in one or more circuits.

14. A non-transitory computer-readable medium comprising computer-executable instructions that, when executed by one or more processors, cause the one or more processors to:
classify, into a first plurality of clusters, a first set of training data including a plurality of failure-inducing patterns, each cluster in the first plurality of clusters including a respective subset of the failure-inducing patterns having a respective failure-inducing topology;
classify, into a second plurality of clusters, a second set of training data including a plurality of patterns that do not induce circuit failures, each cluster in the second plurality of clusters including a respective subset of the patterns having a respective topology;
select a plurality of representative patterns from the plurality of patterns classified into the second plurality of clusters, each representative pattern represents a respective cluster in the second plurality of clusters;
extract a respective plurality of features from each cluster in the first plurality of clusters and from the plurality of representative patterns; and
train each kernel of a plurality of kernels using the respective extracted features to identify the respective failure-inducing topology in a circuit, wherein each of the trained kernels identifies the respective failure-inducing topology different from a failure-inducing topology that another kernel of the plurality of kernels identifies.

15. The computer-readable medium of claim 14, wherein the instructions further cause the one or more processors to:
upsample failure-inducing training data to the first set of training data having a first data size that is based on a second data size of the second set of training data.

16. The computer-readable medium of claim 14, wherein the instructions further cause the one or more processors to:
classify the first set of training data into a plurality of intermediate failure-inducing clusters using string-based classification;
classify the second set of training data into a plurality of intermediate clusters using string-based classification;

create at least one cluster in the first plurality of clusters from each intermediate failure-inducing cluster using density-based classification; and create at least one cluster in the second plurality of clusters from each intermediate cluster using density-based classification.

17. The computer-readable medium of claim 14, wherein the instructions further cause the one or more processors to:

select each representative pattern as a centroid of the respective cluster in the second plurality of clusters; and extract the respective plurality of features from each cluster in the first plurality of clusters and from a plurality of centroids of the second plurality of clusters.

18. The computer-readable medium of claim 14, wherein:

the respective extracted features comprise a plurality of topological critical features and a plurality of non-topological critical features; and the topological critical features are geometry-related critical features, and the non-topological critical features are lithography-process-related critical features.

19. The computer-readable medium of claim 14, wherein the instructions further cause the one or more processors to:

train each kernel by applying an iterative support vector machine (SVM) learning algorithm on the respective extracted features.

20. The computer-readable medium of claim 14, wherein the instructions further cause the one or more processors to:

train the plurality of kernels in an iterative manner until a stopping criterion is satisfied, the stopping criterion being an accuracy rate for detecting a failure-inducing topology in one or more circuits.

* * * * *